United States Patent
Kwak

(10) Patent No.: US 7,684,760 B2
(45) Date of Patent: Mar. 23, 2010

(54) TRANSMISSION POWER CONTROLLER OF A MOBILE COMMUNICATION TERMINAL

(75) Inventor: Soon-Hyeok Kwak, Seoul (KR)

(73) Assignee: LG Electronics Inc., Seoul (KR)

( * ) Notice: Subject to any disclaimer, the term of this patent is extended or adjusted under 35 U.S.C. 154(b) by 444 days.

(21) Appl. No.: 11/056,415

(22) Filed: Feb. 11, 2005

(65) Prior Publication Data

US 2005/0181740 A1 Aug. 18, 2005

(30) Foreign Application Priority Data

Feb. 12, 2004 (KR) ...................... 10-2004-0009332

(51) Int. Cl.
*H04B 1/00* (2006.01)
(52) U.S. Cl. .................. 455/69; 455/67.11; 455/127.1; 455/127.5; 455/68; 455/311; 455/343.5; 455/13.4; 455/574; 455/232.1; 455/194.2; 455/522; 455/517; 455/115.1; 455/115.2; 455/115.3; 455/115.4; 455/136
(58) Field of Classification Search ................. 455/522, 455/68, 67.11, 127.1, 127.5, 311, 343.5, 455/13.4, 574, 232.1, 194.2, 69, 517, 136, 455/115.1, 115.2, 115.3, 115.4
See application file for complete search history.

(56) References Cited

U.S. PATENT DOCUMENTS

| | | | | | |
|---|---|---|---|---|---|
| 4,837,556 | A | * | 6/1989 | Matsushita et al. | 369/47.1 |
| 5,095,542 | A | * | 3/1992 | Suematsu et al. | 455/574 |
| 5,363,020 | A | * | 11/1994 | Chen et al. | 315/209 R |
| 5,548,826 | A | * | 8/1996 | Sayers | 455/126 |
| 5,659,582 | A | * | 8/1997 | Kojima et al. | 375/345 |
| 5,710,991 | A | * | 1/1998 | Lee | 455/126 |
| 5,732,334 | A | * | 3/1998 | Miyake | 455/126 |
| 5,744,944 | A | * | 4/1998 | Danstrom | 323/284 |
| 5,752,171 | A | * | 5/1998 | Akiya | 455/126 |
| 5,774,797 | A | * | 6/1998 | Kawano et al. | 455/127.2 |
| 5,999,829 | A | * | 12/1999 | Chun et al. | 455/572 |
| 6,002,942 | A | * | 12/1999 | Park | 455/522 |
| 6,011,980 | A | * | 1/2000 | Nagano et al. | 455/572 |
| 6,026,278 | A | * | 2/2000 | Suzuki | 340/7.34 |
| 6,029,074 | A | * | 2/2000 | Irvin | 455/571 |
| 6,081,161 | A | * | 6/2000 | Dacus et al. | 330/297 |
| 6,118,988 | A | * | 9/2000 | Choi | 455/115.1 |
| 6,226,502 | B1 | * | 5/2001 | Chung | 455/118 |
| 6,259,901 | B1 | * | 7/2001 | Shinomiya et al. | 455/127.3 |
| 6,265,935 | B1 | | 7/2001 | Kaneda et al. | |

(Continued)

FOREIGN PATENT DOCUMENTS

KR 10 2000 0060719 10/2000

*Primary Examiner*—Duc Nguyen
*Assistant Examiner*—Amar Daglawi
(74) *Attorney, Agent, or Firm*—Lee, Hong, Degerman, Kang & Waimey

(57) ABSTRACT

An apparatus for controlling transmission power of a mobile communication terminal. The apparatus comprises a central processing unit for measuring a power level of a received signal and determining a power amplification mode in response to the measured power level of the received signal and a power preset table, a driver amplifier for amplifying a transmission signal to produce an output signal, the driver amplifier has operating conditions chosen in accordance with the power amplification mode, a voltage converter for outputting a preset voltage value in accordance with the power amplification mode, and a power amplifier for amplifying the output signal of the driver amplifier in response to the outputted preset voltage value.

5 Claims, 5 Drawing Sheets

U.S. PATENT DOCUMENTS

| | | | |
|---|---|---|---|
| 6,298,222 B1* | 10/2001 | Bergveld et al. | 455/127.5 |
| 6,298,241 B1* | 10/2001 | Hong | 455/522 |
| 6,301,485 B1* | 10/2001 | Lee | 455/522 |
| 6,347,231 B1* | 2/2002 | Miya | 455/522 |
| 6,356,745 B1* | 3/2002 | Lee et al. | 455/232.1 |
| 6,369,649 B2* | 4/2002 | Nakajima | 330/51 |
| 6,374,116 B1* | 4/2002 | Peterzell et al. | 455/522 |
| 6,374,127 B1* | 4/2002 | Park | 455/572 |
| 6,430,402 B1* | 8/2002 | Agahi-Kesheh | 455/115.3 |
| 6,522,202 B2* | 2/2003 | Brandt | 330/285 |
| 6,580,901 B1* | 6/2003 | Mochizuki | 455/127.1 |
| 6,591,089 B1* | 7/2003 | Ichihara | 455/115.3 |
| 6,646,511 B2* | 11/2003 | Canyon et al. | 330/297 |
| 6,675,000 B1* | 1/2004 | Ichikawa | 455/127.3 |
| 6,701,138 B2* | 3/2004 | Epperson et al. | 455/127.3 |
| 6,713,992 B2* | 3/2004 | Matsuo et al. | 323/266 |
| 6,718,165 B1* | 4/2004 | Ha | 455/234.2 |
| 6,744,754 B1* | 6/2004 | Lee | 370/342 |
| 6,771,941 B2* | 8/2004 | Kim | 455/127.2 |
| 6,801,759 B1* | 10/2004 | Saifuddin | 455/127.1 |
| 6,832,098 B1* | 12/2004 | Matsunami et al. | 455/522 |
| 6,844,776 B2* | 1/2005 | Schell et al. | 330/10 |
| 6,897,730 B2* | 5/2005 | Dupuis et al. | 330/297 |
| 6,996,381 B2* | 2/2006 | Lee | 455/115.1 |
| 7,023,897 B2* | 4/2006 | Kurihara | 375/130 |
| 7,031,741 B2* | 4/2006 | Lee et al. | 455/522 |
| 7,035,662 B2* | 4/2006 | Lee | 455/522 |
| 7,050,772 B2* | 5/2006 | Herzberg et al. | 455/191.3 |
| 7,102,442 B2* | 9/2006 | Anderson | 330/285 |
| 7,139,537 B2* | 11/2006 | Nakayama | 455/127.1 |
| 7,197,325 B2* | 3/2007 | Kim | 455/522 |
| 2001/0023190 A1* | 9/2001 | Kim | 455/522 |
| 2002/0008576 A1* | 1/2002 | Nakajima | 330/51 |
| 2002/0060573 A1* | 5/2002 | Sakawa et al. | 324/614 |
| 2002/0094835 A1* | 7/2002 | Hayashi et al. | 455/522 |
| 2002/0193134 A1* | 12/2002 | Kim | 455/522 |
| 2003/0068991 A1* | 4/2003 | Lee | 455/126 |
| 2003/0090325 A1* | 5/2003 | Canyon et al. | 330/285 |
| 2003/0144019 A1* | 7/2003 | Nelson et al. | 455/522 |
| 2004/0092233 A1* | 5/2004 | Rudrapatna | 455/69 |
| 2004/0132478 A1* | 7/2004 | Yu | 455/522 |
| 2004/0266473 A1* | 12/2004 | Tsunehara et al. | 455/522 |
| 2005/0101263 A1* | 5/2005 | Kim | 455/78 |
| 2005/0105589 A1* | 5/2005 | Sung et al. | 375/130 |
| 2005/0122162 A1* | 6/2005 | Ishizaki | 330/10 |
| 2005/0242882 A1* | 11/2005 | Anderson | 330/285 |
| 2006/0040697 A1* | 2/2006 | Komatsu | 455/522 |

* cited by examiner

FIG. 5

| POWER VALUE OF RECEIVED SIGNAL | POWER VALUE OF TRANSMISSION SIGNAL | POWER AMPLIFICATION MODE | GAIN VALUE OF DRIVER AMPLIFIER | GAIN FACTOR OF POWER AMPLIFIER (PA_R0) | VOLTAGE CONTROL FACTOR (PA_R0, PA_R1) | APPLIED VOLTAGE OF POWER AMPLIFIER (Vcc) |
|---|---|---|---|---|---|---|
| −72 ~ −77 dBm | 0 ~ 5 dBm | FIRST POWER AMPLIFICATION MODE | 210 ~ 239 | 0 | 0, 0 | 2.5 V |
| −78 ~ −82 dBm | 6 ~ 10 dBm | SECOND POWER AMPLIFICATION MODE | 240 ~ 269 | 0 | 0, 1 | 3V |
| −83 ~ −87 dBm | 11 ~ 15 dBm | THIRD POWER AMPLIFICATION MODE | 270 ~ 299 | 1 | 1, 0 | 3.5V |
| −88 ~ dBm | 16 ~ dBm | FOURTH POWER AMPLIFICATION MODE | 300 ~ | 1 | 1, 1 | 4V |

TRANSMISSION POWER CONTROLLER OF A MOBILE COMMUNICATION TERMINAL

CROSS-REFERENCE TO RELATED APPLICATIONS

Pursuant to 35 U.S.C. § 119 (a), this application claims the benefit of earlier filing date and right of priority to Korean Application No. 10-2004-0009332, filed on Feb. 12, 2004, the contents of which are hereby incorporated by reference herein in its entirety.

BACKGROUND OF THE INVENTION

1. Field of the Invention

The present invention relates to an apparatus and a method for controlling transmission power of a mobile communication terminal capable of improving the terminal power efficiency.

2. Description of the Related Art

The mobile communication terminal moves within a service region formed by a base station (BS). The mobile communication terminal enables radio paging and access to another terminal utilizing switches controlled by a mobile switching center (MSC). A mobile communication terminal performs data communication which may include a symbol, number, character, or the like, and/or a multimedia communication which may include a video signal and a voice communication.

FIG. 1 is a block diagram illustrating an apparatus for controlling the transmission power of a mobile communication terminal in accordance with the related art.

Referring to FIG. 1, the related art apparatus comprises a central processing unit (CPU) 10 for measuring the power level of a received signal. The CPU 10 outputs a gain value based on the measured power level of the received signal. A driver amplifier 20 amplifies a transmission signal in accordance with the gain value. A power amplifier 30 amplifies an output signal from the driver amplifier 20. A power supply unit 40 using an enable signal turns on/off a power source which is applied to the power amplifier upon transmission of the amplified output signal.

FIG. 2 is a flow chart illustrating a method for controlling transmission power of a mobile communication terminal in accordance with the related art.

Referring to FIG. 2, the method includes measuring a power level of a received signal (S21), determining a gain value of a driver amplifier in accordance with the determined power level of the received signal (S23), amplifying a transmission signal in accordance with the determined gain value to produce an output transmission signal, and amplifying the outputted transmission signal using a power amplifier (S27).

In the related art, the CPU 10 measures a power level of a received signal (S21) and outputs a gain control signal. The gain control signal controls a gain value of a driver amplifier 20. The gain value depends on a measured power level of the received signal (S23). The CPU 10 provides a row access strobe random access memory (RAS RAM) 11 for storing the gain value in accordance with the measured power level of the received signal.

The driver amplifier 20 amplifies the transmission signal depending on the outputted gain control signal. The driver amplifier 20 outputs an amplified transmission signal to the power amplifier 30 (S25). The power supply unit 40 is turned-on by an enable signal and applies a specified voltage Vcc to the power amplifier 30. The enable signal is determined in accordance with whether the transmission signal has been transmitted.

The power amplifier 30 amplifies the outputted transmission signal in accordance with the specified voltage Vcc (S27). A duplex element 50 transmits the amplified outputted transmission signal, from the power amplifier 30, through an antenna 60.

The CPU 10 controls the power amplifier 30 using an outputted control signal PA_RO. The power amplifier 30 is driven to either a high gain mode or a low gain mode. The power amplifier 30 is driven in the low gain mode when the power level of the received signal is lower than a preset value. The power amplifier 30 is driven in the high gain mode when the power level of the received signal is greater than the preset value.

In summary, the voltage Vcc turns on/off power to the power amplifier 30 in accordance with whether the transmission signal is to be transmitted. To conserve electrical power and increase overall efficiency of the mobile terminal, the related art mobile terminal communicates with a low signal output level in a strong electric field area. In a weak electric field environment, the related art mobile terminal utilizes a high signal output level. Hence, there is a need for improvements in the related art apparatus and method for further increasing the efficiency of the mobile terminal and providing other advantages over the related art.

SUMMARY OF THE INVENTION

Features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In one embodiment, an apparatus is disclosed for controlling transmission power of a mobile communication terminal. The apparatus comprises a central processing unit for measuring a power level of a received signal and determining a power amplification mode on the basis of the measured power level of the received signal and a power preset table. A driver amplifier is provided for amplifying a transmission signal to produce an output signal. The driver amplifier has operating conditions chosen in accordance with the power amplification mode. A voltage converter outputs a preset voltage value in accordance with the power amplification mode. A power amplifier is provided for amplifying the output signal of the driver amplifier in response to the outputted preset voltage value.

In another embodiment, a method is disclosed for controlling transmission power of a mobile terminal. The method comprises measuring a power level of a received signal, determining a power amplification mode based on the measured power level of the received signal and a power preset table, amplifying a transmission signal in accordance with the power amplification mode to produce an output transmission signal, outputting a preset voltage value in accordance with the power amplification mode, and amplifying the output transmission signal in accordance with the outputted preset voltage value.

Additional features and advantages of the invention will be set forth in the description which follows, and in part will be apparent from the description, or may be learned by practice of the invention. It is to be understood that both the foregoing general description and the following detailed description of the present invention are exemplary and explanatory and are intended to provide further explanation of the invention as claimed.

These and other embodiments will also become readily apparent to those skilled in the art from the following detailed description of the embodiments having reference to the attached figures, the invention not being limited to any particular embodiments disclosed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

Features, elements, and aspects of the invention that are referenced by the same numerals in different figures represent the same, equivalent, or similar features, elements, or aspects in accordance with one or more embodiments.

FIG. 5 is a diagram illustrating a power preset table for various amplification modes in accordance with the present invention.

DETAILED DESCRIPTION OF THE PREFERRED EMBODIMENTS

The present invention relates to an apparatus and method for controlling transmission power of a mobile communication terminal capable of improving the mobile communication terminal power efficiency. More specifically, a mobile communication terminal is disclosed which improves mobile communication terminal efficiency by adjusting voltage levels applied to an apparatus for controlling transmission power in accordance with a power level of a received signal.

Although the invention is illustrated with respect to a mobile communication terminal, it is contemplated that the invention may be utilized anywhere it is desired for providing improved transmission power efficiency within a mobile communication system. Reference will now be made in detail to the preferred embodiments of the present invention, examples of which are illustrated in the accompanying drawings.

Figure 1:
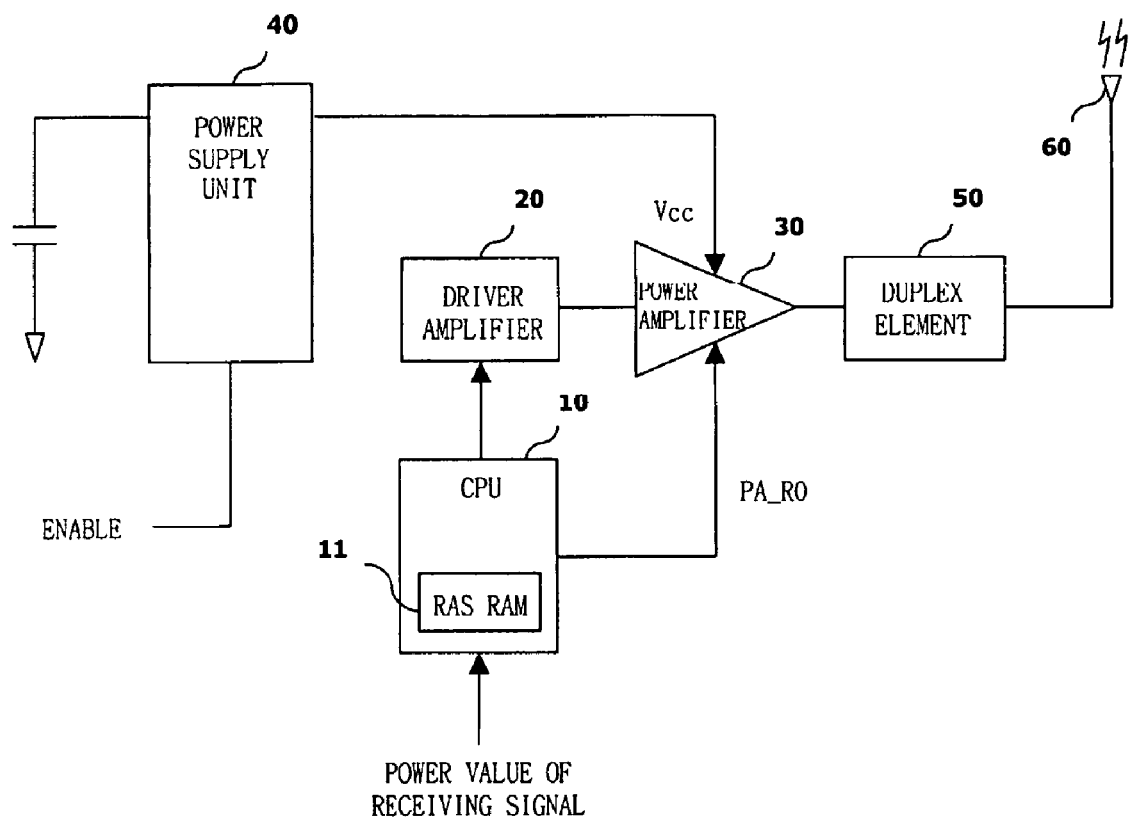
FIG. 1 is a block diagram illustrating an apparatus for controlling transmission power of a mobile communication terminal in accordance with the related art.
Figure 2:
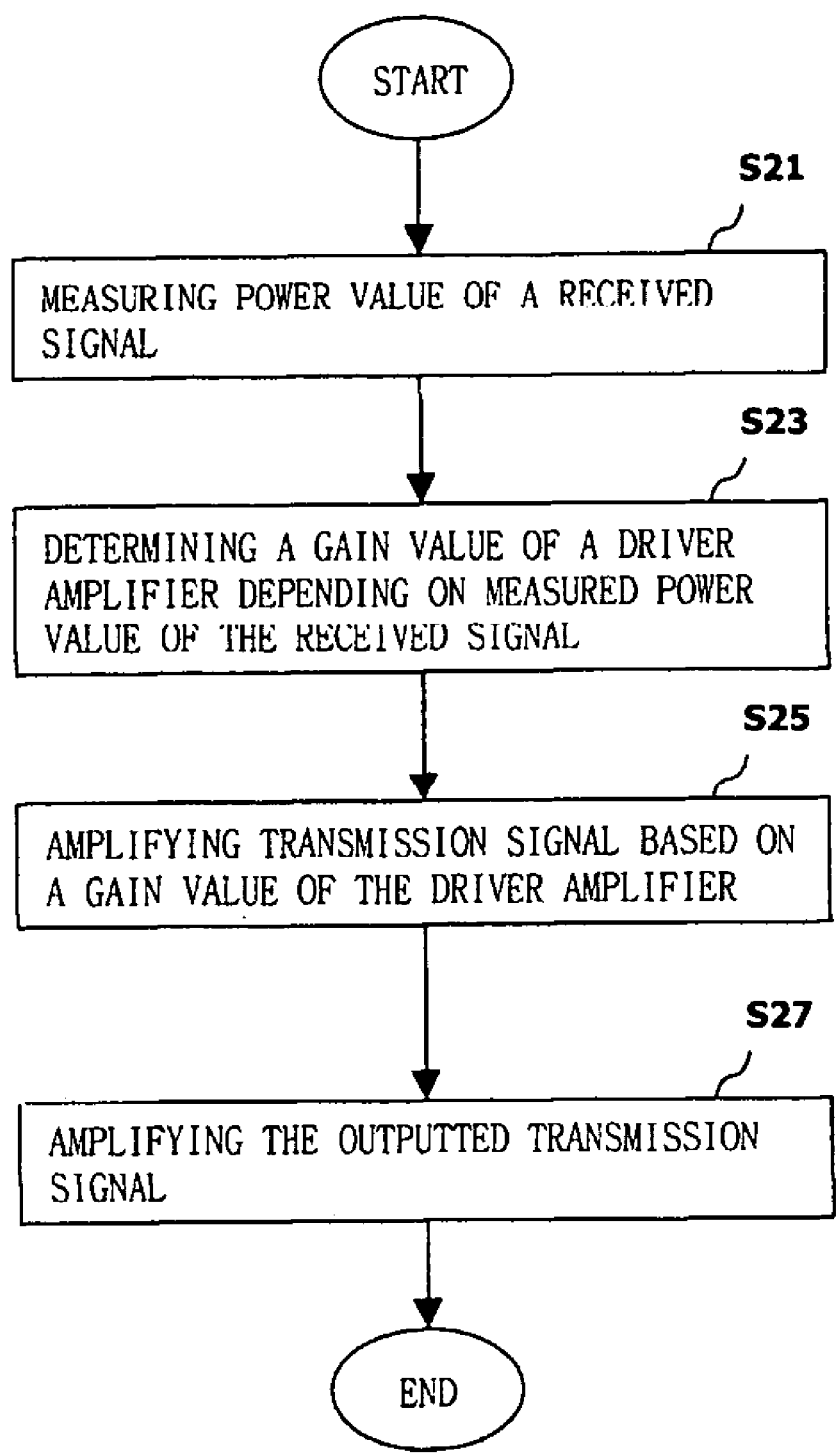
FIG. 2 is a flow chart illustrating a method for controlling transmission power of a mobile communication terminal in accordance with the related art.
Figure 3:
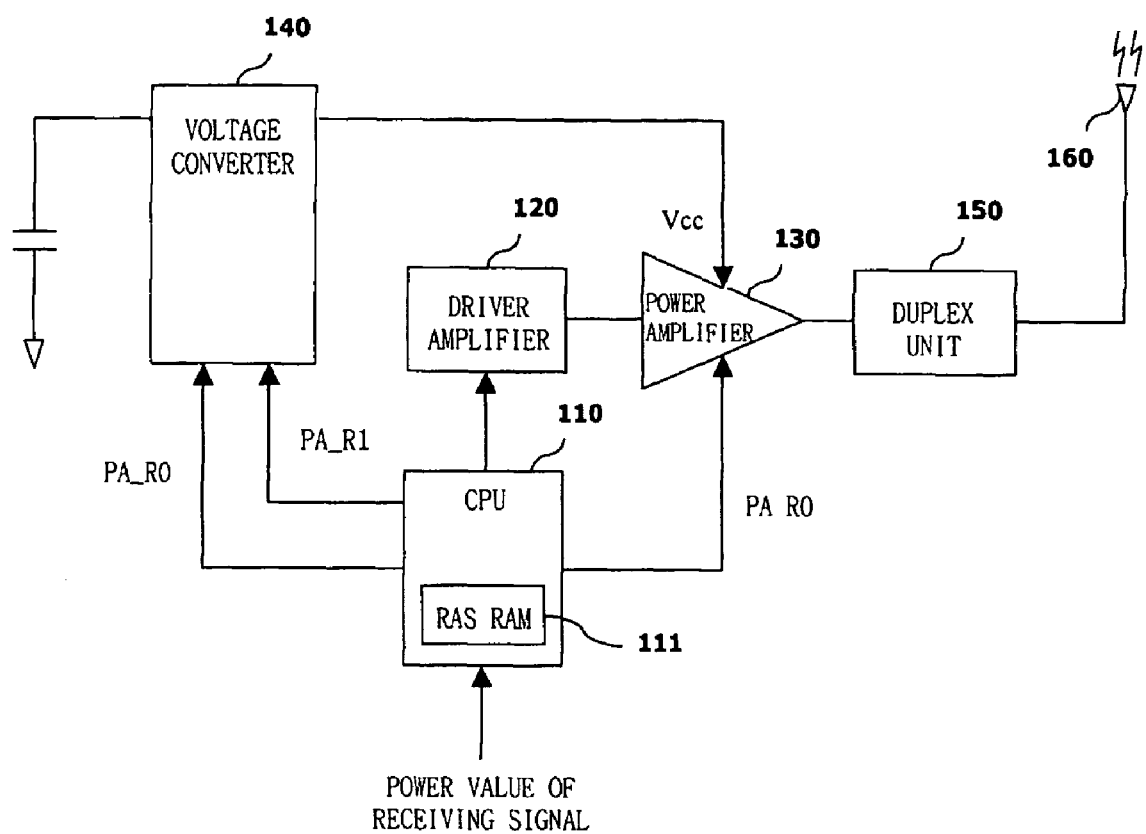
FIG. 3 is a block diagram illustrating an apparatus for controlling transmission power of a mobile communication terminal in accordance with the present invention.

FIG. 3 is a block diagram illustrating an apparatus for controlling transmission power of a mobile communication terminal in accordance with a preferred embodiment of the present invention.

Referring to FIG. 3, a central processing unit (CPU) 110 measures a power level of a received signal and determines a power amplification mode based on the measured power level of the received signal and values contained in the power preset table. A driver amplifier 120 amplifies a transmission signal based on the power amplification mode. A voltage converter, such as a DC/DC converter, 140 outputs a preset voltage value in accordance with the power amplification mode. A power amplifier 130 amplifies an output driver amplifier signal on the basis of the output preset voltage value. The CPU 110 provides a row access strobe random access memory (RAS RAM) 111 that stores the power amplification mode in accordance with the measured power level of the received signal. The CPU 110 provides information, such as a gain value of the driver amplifier, a voltage control factor (PA_R0, PA_R1), an applied voltage value (Vcc), and a gain factor of the power amplifier (PA_RO), in accordance with the power amplification mode. The CPU 110 stores the information, in accordance with the power amplification mode, in a power preset table.

The voltage converter 140 receives a two-bit control signal, for example, a digital value of (0,0), (0,1), (1,0) and (1,1) from the control signal PA_R0 and PA_R1 provided by the CPU 110. In response to the two-bit control signal, the voltage converter 140 outputs a preset voltage value. The preset voltage value, in this example, is 2.5V, 3V, 3.5V or 4V which value is chosen in accordance with the two-bit control signal. The preset voltage value, in this example, was experimentally determined but other values may be used. The preset voltage value is preferably established during the manufacturing process of the mobile communication terminal.

Figure 4:
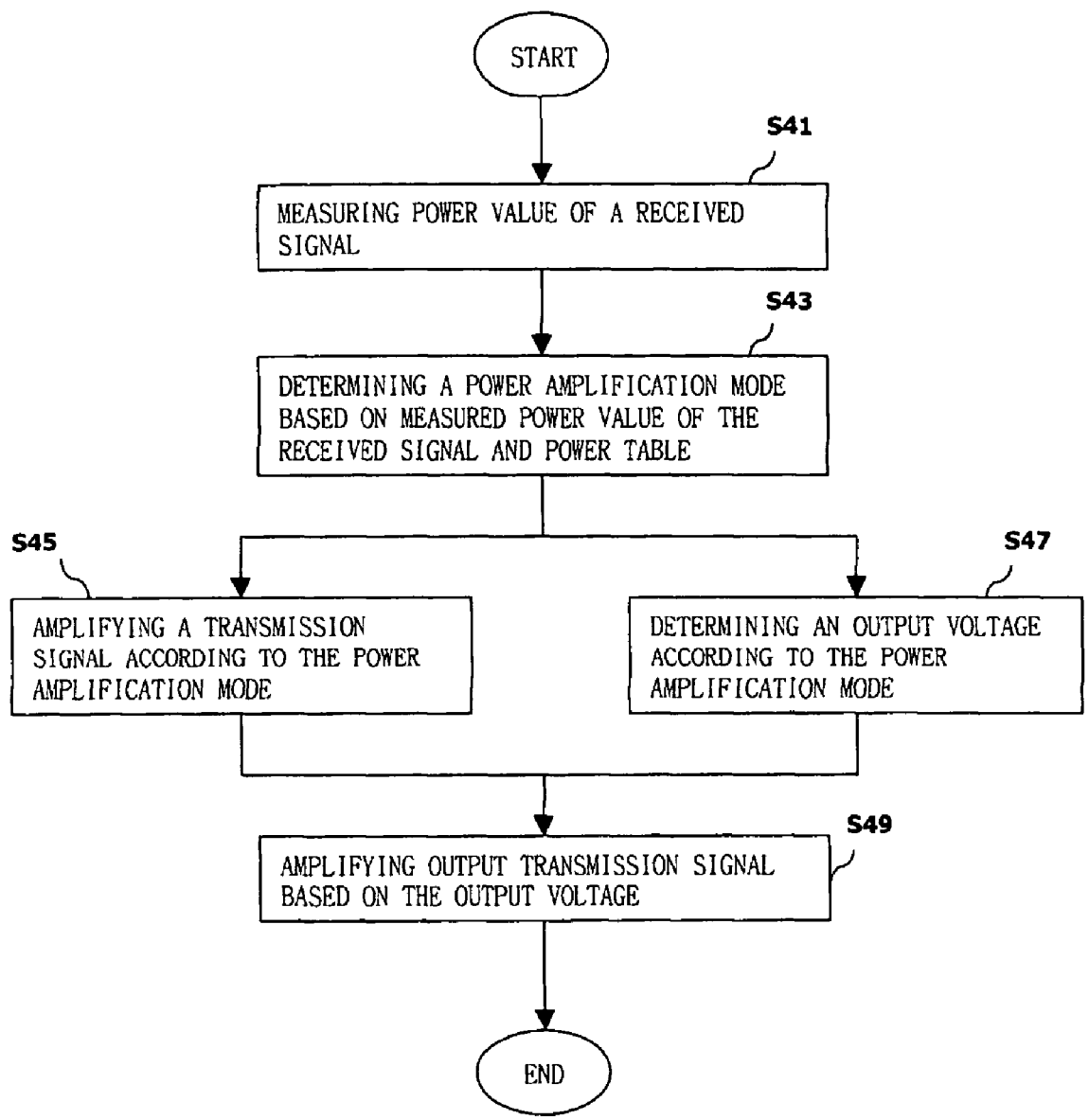
FIG. 4 is a flow chart illustrating a method for controlling transmission power of a mobile communication terminal in accordance with the present invention.

FIG. 4 is a flow chart illustrating a method for controlling transmission power of a mobile communication terminal in accordance with the present invention. For the components referenced in the below flow chart, please refer to FIG. 3.

As shown in FIG. 4, the method includes measuring a power level of a received signal (S41), determining a power amplification mode on the basis of the measured power level of the received signal and values of a power preset table (S43), amplifying a transmission signal depending on the power amplification mode (S45), determining an output voltage depending on the power amplification mode (S47), and amplifying a transmission signal depending on the determined output voltage (S49).

The method described in detail below controls the transmission power of the mobile communication terminal in accordance with the preferred embodiment of the present invention.

The mobile communication terminal stores a power preset value, for example, which is determined experimentally within the RAS RAM 111. The power preset value is specified for outputting a desired power level of the transmission signal in response to a power level of the received signal. The preset values preferably precisely control the transmission power of the mobile terminal. The power preset table provides information for a specified power amplification mode which is determined in accordance with the measured power level of the received signal. The information, in this example, includes a gain value for the driver amplifier, a voltage control factor, and an applied voltage value and a gain factor for the power amplifier.

The CPU 110 measures the power level of the received signal (S41). The CPU 110 reads a gain value of the driver amplifier 120 (shown in FIG. 3). The voltage control factor and the applied voltage value and gain factor of the power amplifier are provided that correspond to a measured power level of the received signal from the RAS RAM 111 (shown in FIG. 3). The power amplification mode is specified in accordance with the measured power level of the received signal, the gain value of the driver amplifier, the voltage control factor, the applied voltage value, and the gain factor of the power amplifier (S43).

The CPU 110 outputs the determined gain value to the driver amplifier 120. The driver amplifier 120 amplifies the transmission signal. The output signal of the driver amplifier 120 is provided to the power amplifier 130 (S45).

The CPU 110 outputs the voltage control factor to the voltage converter 140. The outputted voltage control factor, in this example, is a two-bit control signal. The two-bit control signal may be (0,0), (0,1), (1,0) and (1,1). The CPU 110 applies the gain factor to the power amplifier 130. The power amplifier 130 is driven, in this example, to either a high gain or low gain mode.

The voltage converter 140 outputs a preset applied voltage value Vcc to the power amplifier 130 on the basis of the outputted voltage control factor (S47). The power amplifier 130 amplifies the output transmission signal from the driver amplifier on the basis of the applied voltage value Vcc (S49). The duplex unit 150 transmits the amplified output transmission signal through an antenna 160.

FIG. 5 is a diagram illustrating the power preset table in accordance with the preferred embodiment of the present invention.

Referring to FIG. 5, the power amplification mode, in this example, is set to one of four modes in response to the received signal to achieve a transmission signal having a specified output power range. A first amplification mode achieves a 0~5 dBm transmission signal output value. A second power amplification mode achieves a 6~10 dBm transmission signal output value. A third power amplification mode achieves a 11~15 dBm transmission signal output value. A fourth power amplification mode achieves more than 16 dBm transmission signal output value. The mobile communication terminal measures the power level of the received signal for efficiently controlling the power of the transmission signal depending on the measured power level of the received signal. The power amplification mode is not limited to a first, second, third and fourth power amplification modes. In the alternative, the amplification modes may be segmented (not shown) into more transmission signal output values in accordance with the power level of the received signal. The power amplification mode preferably contains information that accounts for the environmental conditions of the received signal.

An integrated example is disclosed hereafter for the present invention illustrating the FIG. 3 components, FIG. 4 flow chart, and FIG. 5 information. In this example, the measured power level of the received signal is −79 dBm. The CPU 110 determines the required power level of the transmission signal in accordance with a measured power level of the received signal. The CPU 110, in this example, selects the second power amplification mode. The CPU 110 outputs the control signal (0,1) to the voltage converter 140 based on values of the power preset table stored the RAS RAM 111. The CPU 110 outputs the gain value to the driver amplifier 120. The Voltage converter 140 applies 3V to the power amplifier 130 using the outputted voltage control factor (0,1). The driver amplifier 120 outputs an amplified transmission signal to the power amplifier 30 depending on the gain value. The power amplifier 130 amplifies a power level of the outputted amplified transmission signal to the preset power level of 6~10 dBm based on the applied voltage.

The apparatus and method of the present invention disclosed applies voltages to the power amplifier in accordance with a power preset table depending on the power level of the received signal to improve transmission power efficiency of the mobile terminal.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An apparatus for controlling transmission power of a mobile communication terminal, the apparatus comprising:

a central processing unit for measuring a power level of a received signal and for selecting one of a plurality of power amplification modes in response to the measured power level of the received signal, wherein each of the plurality of power amplification modes is stored in a power preset table comprising at least a driver amplifier gain value, a power amplifier gain factor, and a digital voltage control factor;

a driver amplifier for amplifying a transmission signal to produce an output signal responsive to the driver amplifier gain value;

a voltage converter for outputting a voltage responsive to the digital voltage control factor, wherein the digital voltage control factor comprises at least two bits corresponding to one of a plurality of voltages available to be outputted from the voltage converter in accordance with the selected power amplification mode; and a power amplifier for amplifying the output signal of the driver amplifier in response to the voltage outputted from the voltage converter and the power amplifier gain factor, wherein the gain factor for the power amplifier is one of a high gain mode and a low gain mode, and wherein the voltage converter is a DC to DC converter, and wherein the number of power amplification modes is determined in accordance with the power level of the received signal, the number of power amplification modes being equal to the number of voltages available to be outputted from the voltage converter.

2. The apparatus of claim 1, wherein the central processing unit comprises a memory for storing the power preset table.

3. The apparatus of claim 1, wherein each of the plurality of power amplification modes comprises one of four different modes.

4. A method for controlling transmission power of a mobile terminal, the method comprising:

measuring a power level of a received signal and selecting one of a plurality of power amplification modes in response to the measured power level of the received signal, wherein each of the plurality of power amplification modes is stored in a power preset table comprising at least a driver amplifier gain value, a power amplifier gain factor, and a digital voltage control factor;

amplifying a transmission signal to produce an output signal responsive to the driver amplifier gain value;

outputting a voltage responsive to the digital voltage control factor, wherein the digital voltage control factor comprises at least two bits corresponding to one of a plurality of voltages available to be outputted from the voltage converter in accordance with the selected power amplification mode; and amplifying the output signal of the driver amplifier in response to the voltage outputted from the voltage converter and the power amplifier gain factor, wherein the gain factor for the power amplifier is one of a high gain mode and a low gain mode, and wherein the voltage converter is a DC to DC converter, and wherein the number of power amplification modes is determined in accordance with the power level of the received signal, the number of power amplification modes being equal to the number of voltages available to be outputted from the voltage converter.

5. The method of claim 4, wherein each of the plurality of power amplification modes comprises one of four different modes.

* * * * *